United States Patent [19]

Barsky

[11] Patent Number: 5,083,757
[45] Date of Patent: Jan. 28, 1992

[54] ROTATIONAL FLEXURE STAGE

[75] Inventor: Samuel M. Barsky, Wakefield, Mass.

[73] Assignee: General Signal Corporation, Stamford, Conn.

[21] Appl. No.: 548,081

[22] Filed: Jul. 5, 1990

[51] Int. Cl.⁵ .............................................. F16F 1/18
[52] U.S. Cl. ...................................... 267/181; 248/184
[58] Field of Search ............... 267/181, 160, 161, 162, 267/163; 248/184, 476; 137/845, 852, 855

[56] References Cited

U.S. PATENT DOCUMENTS 3,648,999  3/1972  Bauer ................................. 267/160
4,601,376  7/1986  Reik ............................... 267/161 X

FOREIGN PATENT DOCUMENTS 1418533  8/1988  U.S.S.R. ............................. 267/160

Primary Examiner—George E. A. Halvosa
Attorney, Agent, or Firm—Henry D. Pahl, Jr.

[57] ABSTRACT

The flexure stage disclosed herein is useful in aligning a semiconductor wafer during microlithographic exposure to define circuit elements on the surface of the wafer. The stage is a unitary structure which permits essentially lossless small angle relative rotation of a central portion of the stage with respect to an outer, annular portion of the stage. Three pairs of slots define three links extending radially with respect to the axis of rotation and, radially outwardly from each pair of slots, a respective transverse slot in the outer portion provides radial compliance for the outer end of the respective link.

4 Claims, 1 Drawing Sheet

ROTATIONAL FLEXURE STAGE

BACKGROUND OF THE INVENTION

The present invention relates to microlithography and more particularly to a unitary flexure stage permitting essentially lossless small angle relative rotation.

In the manufacture of semiconductor integrated circuits, circuit features are formed by making successive microlithographic exposures on resists coated on the surface of a semiconductor wafer. As is understood, it is essential to the manufacturing process that successive exposures be precisely aligned with each other. To achieve this alignment, it is necessary to provide both translational and rotational freedom of movement of the wafer relative to the projected image. The projected image is typically determined by a reticle held in a step and repeat microlithographic projector. In order to permit a servo system to accurately position the wafer for the last or fine adjustment process, it is important that freedom of movement be provided by means of a system of mounting or support which does not introduce loss or mechanical hysteresis and which does not introduce spurious or unstable forces which would disrupt the accuracy of the servo system.

The present invention is particularly concerned with the provision of a stage which permits essentially lossless small angle relative rotation of a central portion of a stage with respect to an outer or annular portion.

Among the several objects of the present invention may be noted the provision of a stage permitting essentially lossless small angle relative rotation; the provision of such a stage which does not introduce unstable or reversing forces; the provision of such a stage which does not exhibit hystersis; the provision of such a stage which facilitates highly accurate positioning; the provision of such a stage which is highly reliable and which is of relatively simple and inexpensive construction. Other objects and features will be in part apparent and in part pointed out hereinafter.

SUMMARY OF THE INVENTION

A unitary flexure stage according to the present invention permits essentially lossless small angle relative rotation of a central portion of the stage with respect to an outer annular portion of the stage. Three pairs of slot define three links extending radially with respect to the axis of rotation from respective points of attachment to the central portion. Radially outwardly from each pair of slots, a respective transverse slot provides radial compliance for the outer end of the respective link. Peripheral slot segments separate the central portion from the outer annular portion between the links.

BRIEF DESCRIPTION OF THE DRAWINGS

Corresponding reference characters indicate corresponding parts throughout the several views of the drawings.

DESCRIPTION OF THE PREFERRED EMBODIMENT

Figure 1:
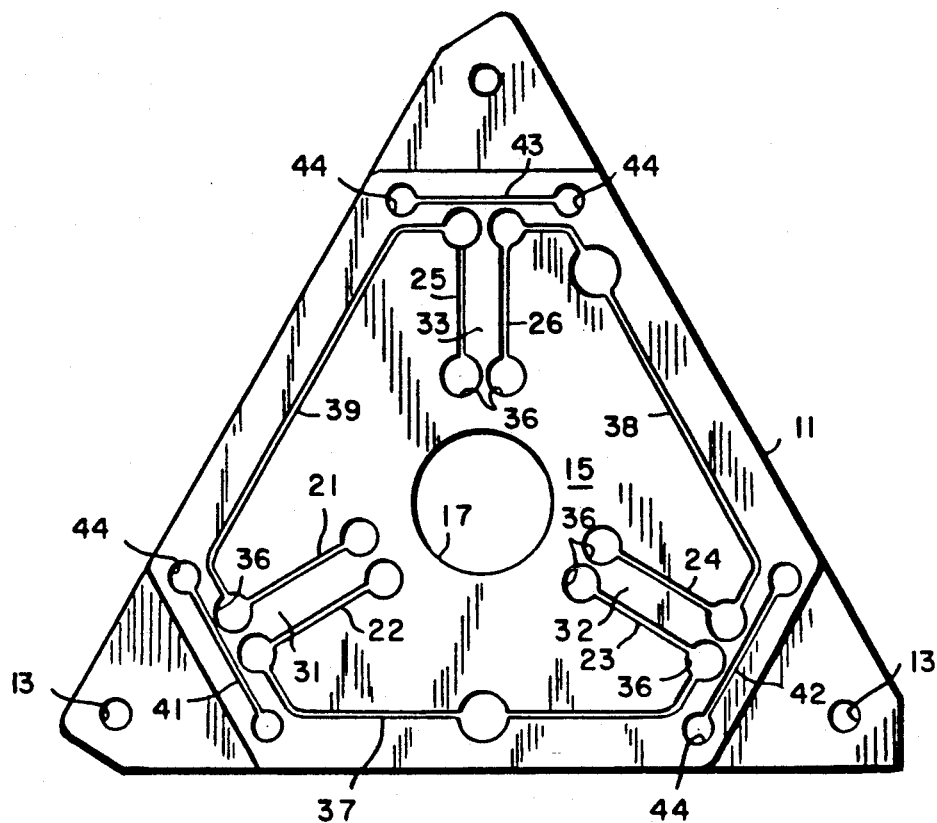
FIG. 1 is a plan view of a flexure stage constructed in accordance with the present invention.
Figure 2:
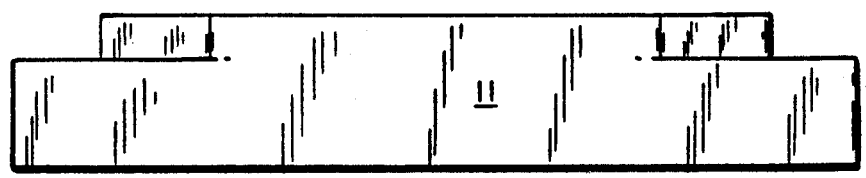
FIG. 2 is a side view of the stage of FIG. 1.
Figure 3:
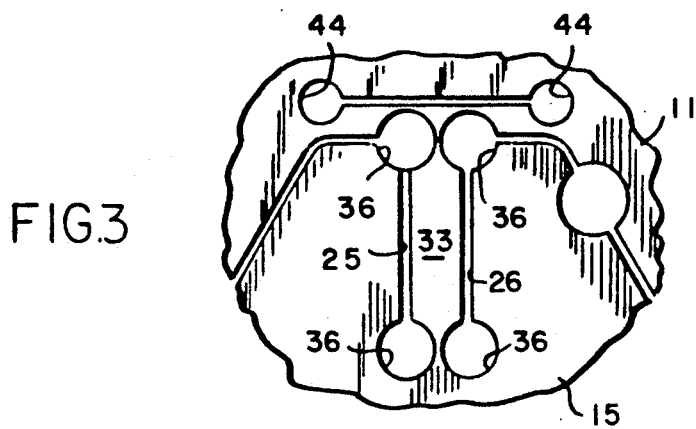
FIG. 3 is an enlarged view of a portion of FIG. 1.

Referring now to FIG. 1, it should be understood that the flexure stage illustrated is constructed as a unitary system by machining the structure from a single block of a material providing appropriate compliance and elasticity. The presently preferred material is 6061-T651 aluminum. As is understood, multiple integrated circuits are typically formed on a single wafer and then separated after manufacture. In the overall microlithographic apparatus in which the stage of FIG. 1 is employed, the stage of FIG. 1 is itself mounted on an X-Y translational stage which allows separate regions of a semiconductor wafer to be brought within the field of a projection lens.

The flexure stage provides two portions which are rotatable relative to each other for small angles. In the particular embodiment illustrated, there is an outer portion, designated by reference character 11, which may be considered to be stationary with respect to the rotation permitted by the stage. This outer or annular portion is generally triangular and can be attached to the X-Y stage at the three corners by means of bolts passing through apertures as indicated by reference character 13. The inner or relatively rotatable portion of the flexure stage is designated by reference character 15. The central portion 15 includes a central aperture 17 through which portions of a wafer holding chuck may extend. The axis of rotation of the stage passes essentially centrally through this aperture.

Extending radially with respect to the axis of rotation are three pairs of slots 21 and 22, 23 and 24, and 25 and 26 which thereby define three links 31-33 which extend from respective points of attachment on the central portion 15 radially outwardly to the outer portion 11. Each of the radial slots is terminated at each end with a cylindrical bore 36 so that adjacent bores define between them thin or necked down portions at each end of the respective link. As will be understood, these thin or necked down portions are relatively compliant so that each of the links can tilt over a small angle so as to allow the central portion 15 to rotate over a small angle with respect to the outer portion 11. Between the several radial link structures, peripheral slot segments, designated by reference characters 37-39, separate the central portion 11 from the outer annular portion 13 so that the two portions are separate except for the radial links.

Though the angles of rotation contemplated are relatively small, there is in fact some stretching force applied to each radial link as the central portion rotates. To accommodate corresponding radial movement, the flexure stage of the present invention includes, transverse to each pair of slots, a corresponding relief slot 41-43 in the annular or outer portion 11. Each transverse relief slot passes closely adjacent the outer bores 36 terminating each of the respective pair of slots so as to again provide thin or necked down regions. Likewise, each end of each transverse slot is terminated by a bore, these bores being designated by the reference character 44. As will be understood by those skilled in the art, the transverse slots 41-43 provide radial compliance preventing the build up of radial forces in the links 31-33 and their associated flexure points. Without the transverse slots, the compressive and extensive forces on the individual links 31-33 would provide a non-linear or even reversing force component which could interfere with the accuracy of the servo system employed to control the rotational movement so as to achieve image alignment. However, with the particular arrangement of links and relieving slots, the stage illustrated provides relatively lossless small angle rotation with a normal or monotonic spring or compliance characteristic.

In view of the foregoing it may be seen that several objects of the present invention are achieved and other advantageous results have been attained.

As various changes could be made in the above constructions without departing from the scope of the invention, it should be understood that all matter contained in the above description or shown in the accompanying drawings shall be interpreted as illustrative and not in a limiting sense.

What is claimed is:

1. A unitary flexure stage permitting essentially lossless relative small angle rotation around a central axis, said stage comprising a body of elastic material having therein:
   three pairs of parallel slots defining three links extending radially with respect to said axis from respective points of attachment to a central portion of said body;
   cylindrical bores at each end of each of the slots of said pairs, the adjacent bores at corresponding ends of each pair being closely adjacent thereby providing a necked down region at the respective end of the link establishing a compliant region;
   located radially outwardly from each pair of slots in an outer, annular portion of said body, a respective relief slot, said relief slot extending transversely of the respective pair of radial slots and closely adjacent the respective pair of bores at substantially radially outer ends of slots thereby to provide radial compliance for the respective link; and
   peripheral slot segments separating said central portion from said outer annular portion between said links.

2. A stage as set forth in claim 1 further including a cylindrical bore at each end of each of said transverse relief slots.

3. A unitary flexure stage permitting essentially lossless relative small angle rotation of a central portion of the stage with respect to an outer, annular portion of the stage around a central axis, said stage comprising a generally flat metal body having therein:
   three pairs of parallel slots defining three links extending radially with respect to said axis from respective points of attachment to said central portion;
   at each end of each of said slots, a cylindrical bore, the adjacent bores at corresponding ends of each pair being closely adjacent thereby providing a necked down region at the respective end of the respective link;
   radially outwardly from the bores at an outer end of each pair of slots, a respective transverse slot in said outer portion passing closely adjacent the respective pair of bores at substantially radially outer ends of said slots providing radial compliance for the respective link; and
   peripheral slot segments separating said central portion from said outer annular portion between said links.

4. A stage as set forth in claim 3 wherein said metal is aluminum.

* * * * *